US008598747B2

(12) United States Patent
Bilbrey et al.

(10) Patent No.: US 8,598,747 B2
(45) Date of Patent: Dec. 3, 2013

(54) WIRELESS POWER UTILIZATION IN A LOCAL COMPUTING ENVIRONMENT

(75) Inventors: Brett C. Bilbrey, Sunnyvale, CA (US); Michael Culbert, Monte Sereno, CA (US); Diane Leslie Culbert, legal representative, Monte Sereno, CA (US); Peter M. Arnold, Cupertino, CA (US); David I. Simon, San Francisco, CA (US); Mushtaq Sarwar, San Jose, CA (US); Richard W. DeVaul, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/989,047

(22) PCT Filed: Nov. 18, 2011

(86) PCT No.: PCT/US2011/061384
§ 371 (c)(1),
(2), (4) Date: May 22, 2013

(87) PCT Pub. No.: WO2012/071268
PCT Pub. Date: May 31, 2012

(65) Prior Publication Data
US 2013/0241308 A1 Sep. 19, 2013

Related U.S. Application Data

(60) Provisional application No. 61/416,701, filed on Nov. 23, 2010.

(51) Int. Cl.
*H01F 38/00* (2006.01)
(52) U.S. Cl.
USPC .......................................... 307/104

(58) Field of Classification Search
USPC .......................................... 307/104
See application file for complete search history.

(56) References Cited

U.S. PATENT DOCUMENTS

| 2009/0243394 A1 | 10/2009 | Levine |
| 2009/0271048 A1 | 10/2009 | Wakamatsu |
| 2009/0289595 A1 | 11/2009 | Chen et al. |
| 2010/0323616 A1 | 12/2010 | Von Novak et al. |

FOREIGN PATENT DOCUMENTS

| EP | 0786835 A2 | 7/1997 |
| JP | 2006-314181 A | 11/2006 |

(Continued)

OTHER PUBLICATIONS

PCT International Search Report, Application No. PCT/US2011/061384 dated Feb. 14, 2013.

(Continued)

*Primary Examiner* — Rexford Barnie
*Assistant Examiner* — Dru Parries
(74) *Attorney, Agent, or Firm* — Womble Carlyle Sandridge & Rice LLP

(57) ABSTRACT

Various embodiments of a wirelessly powered local computing environment are described. The wireless powered local computing environment includes at least a near field magnetic resonance (NFMR) power supply arranged to wirelessly provide power to any of a number of suitably configured devices. In the described embodiments, the devices arranged to receive power wirelessly from the NFMR power supply must be located in a region known as the near field that extends no further than a distance D of a few times a characteristic size of the NFMR power supply transmission device. Typically, the distance D can be on the order of 1 meter or so.

21 Claims, 14 Drawing Sheets

(56) References Cited

FOREIGN PATENT DOCUMENTS

| WO | 2007/089680 A2 | 8/2007 |
| WO | 2007/146164 A2 | 12/2007 |
| WO | 2009/039113 A1 | 3/2009 |
| WO | 2009/039115 A2 | 3/2009 |
| WO | 2009/111597 A2 | 9/2009 |
| WO | 2009/122355 A2 | 10/2009 |
| WO | 2009/131990 A2 | 10/2009 |

OTHER PUBLICATIONS

PCT Written Opinion, Application No. PCT/US2011/061384 dated Feb. 14, 2013.

Disclosed Anonymously, "Wireless Conductive AC/DC Power for Laptops and Other Devices", IP.com No. IPCOM000197537D, published Jul. 13, 2010 (5 pages).

WIRELESS POWER UTILIZATION IN A LOCAL COMPUTING ENVIRONMENT

CROSS-REFERENCE TO RELATED APPLICATIONS

This application is a national phase filing under 35 U.S.C. 371(c) of and claims priority to, PCT Pat. Appl. No. 2011/061384 filed Nov. 18, 2011, entitled "WIRELESS POWER UTILIZATION IN A LOCAL COMPUTING ENVIRONMENT" which claims the benefit under 35 U.S.C. 119(e) of U.S. Provisional Patent Application No. 61/416,701, filed Nov. 23, 2010 and entitled "WIRELESS POWER UTILIZATION IN A LOCAL COMPUTING ENVIRONMENT" which is incorporated herein by reference in its entirety for all purposes.

TECHNICAL FIELD

The described embodiments relate generally to wireless charging, and more specifically to devices, systems, and methods related to allocating power to receiver devices that may be located in wireless power systems.

BACKGROUND

Energy or power may be transferred wirelessly using a variety of known radiative, or far-field, and non-radiative, or near-field, techniques. For example, radiative wireless information transfer using low-directionality antennas, such as those used in radio and cellular communications systems and home computer networks, may be considered wireless energy transfer. However, this type of radiative transfer is very inefficient because only a tiny portion of the supplied or radiated power, namely, that portion in the direction of, and overlapping with, the receiver is picked up. The vast majority of the power is radiated away in all the other directions and lost in free space. Such inefficient power transfer may be acceptable for data transmission, but is not practical for transferring useful amounts of electrical energy for the purpose of doing work, such as for charging electrical devices.

One way to improve the transfer efficiency of some radiative energy transfer schemes is to use directional antennas to confine and preferentially direct the radiated energy towards a receiver. However, these directed radiation schemes may require an uninterruptible line-of-sight and potentially complicated tracking and steering mechanisms in the case of mobile transmitters and/or receivers. In addition, such schemes may pose hazards to objects or people that cross or intersect the beam when modest to high amounts of power are being transmitted. A known non-radiative, or near-field, wireless energy transfer scheme, often referred to as either induction or traditional induction, does not (intentionally) radiate power, but uses an oscillating current passing through a primary coil, to generate an oscillating magnetic near-field that induces currents in a near-by receiving or secondary coil. Traditional induction schemes have demonstrated the transmission of modest to large amounts of power, however only over very short distances, and with very small offset tolerances between the primary power supply unit and the secondary receiver unit. Electric transformers and proximity chargers are examples of devices that utilize this known short range, near-field energy transfer scheme.

What is desired are methods, systems, and apparatus for efficient and user friendly interaction between peripheral devices in a wirelessly powered local computing environment.

SUMMARY

This paper describes various embodiments that relate to a system, method, and apparatus for wirelessly providing power from a wireless power supply to any of a plurality of peripheral devices.

A near field magnetic resonance (NFMR) power supply arranged to use a resonance channel to transfer energy to resonance circuits within a near field distance D, the distance D defining an outermost range of the NFMR power supply is described. The NFMR power supply includes at least a high frequency (HF) power source for providing a high frequency, orthogonal in-band power, a base plate that provides high frequency (HF) power coupled to the HF power source, and at least two "D" shaped resonators arranged to receive HF power from the base plate. The at least two "D" shaped resonators are driven 180° out of phase with each other such that the magnetic fields produced by the at least two "D" shaped resonators provide a symmetric magnetic field at a resonant frequency.

In one aspect of the described embodiments, the symmetric magnetic field is circularly polarized. The circularly polarized magnetic field being spatially symmetric about at least two axes provides a symmetric power reception at a peripheral device independent of the spatial relationship between the peripheral device and the NFMR power supply.

In yet another aspect, the resonant frequency of the NFMR power supply is dynamically tunable to any frequency by at least changing a shape of at least one resonator of the NFRM using, for example, a piezoelectric shaping technique.

In another embodiment, a method of determining a resonant frequency of a wirelessly powered local computing environment is disclosed. In the described embodiment, the wirelessly powered local computing environment includes at least a dynamically tunable near field magnetic resonance (NFMR) power supply arranged to wirelessly provide power to at least one receiving unit located within an effective range D of the NFMR power supply by way of a resonance channel, and a communication mechanism for providing a communication channel separate from the resonance channel between the NFMR power supply and the at least one receiving unit. The method can be carried out by performing at least the following operations: providing a magnetic field at a first frequency by the NFMR power supply, receiving over the communication channel an indication of an amount of wireless power received at the receiving unit over the resonance channel from the NFMR power supply, updating the first frequency of the NFMR power supply to a second frequency by dynamically tuning the NFMR power supply if the received indication is less than a maximum power, otherwise setting the resonant frequency as the first frequency.

In yet another embodiment, a wirelessly powered local computing environment is disclosed. The wirelessly powered local computing environment includes at least a near field magnetic resonance (NFMR) power supply comprising a first symmetric magnetic resonator structure and at least one peripheral device. The peripheral device, in turn, includes a second symmetric magnetic resonance structure having a shape in accordance with the first symmetric resonator structure. The NFMR power supply uses the first symmetric magnetic resonance structure to create a symmetric magnetic field and a resonance channel coupling the NFMR power supply and the at least one peripheral device used to transfer useable energy from the first symmetric magnetic resonator structure and the second magnetic resonator structure. The wirelessly powered local computing environment also includes at least a central processing unit in communication with the NFMR power supply, the central processing unit providing processing resources to the NFMR power supply.

Other aspects and advantages of the invention will become apparent from the following detailed description taken in conjunction with the accompanying drawings which illustrate, by way of example, the principles of the described embodiments.

DETAILED DESCRIPTION

Figure 1:
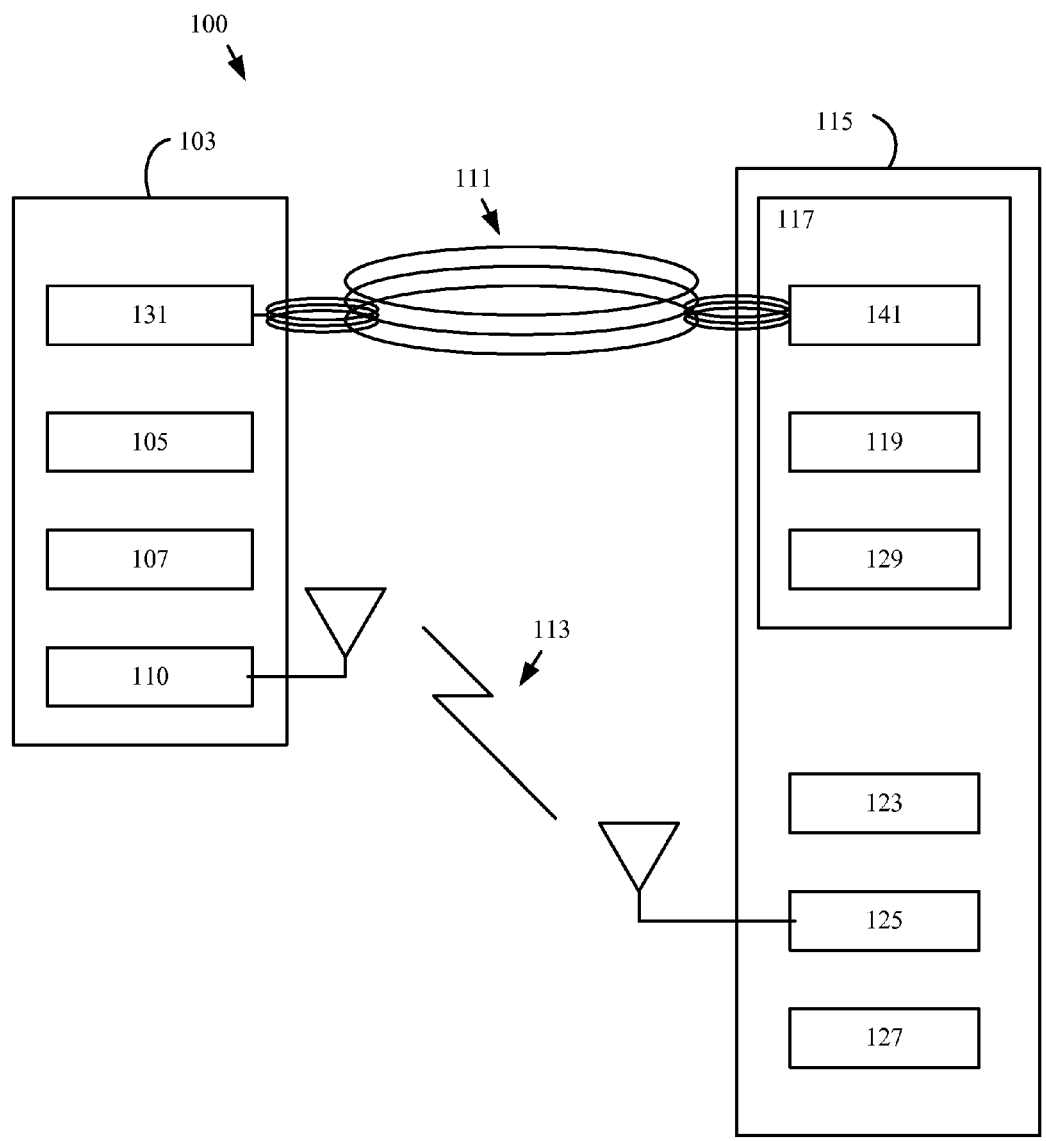
FIG. 1 is a block diagram illustrating a wireless power delivery system that includes a power transmitting unit and a target electronic device where power is delivered wirelessly employing magnetic waves.

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

The following relates to techniques and apparatus for providing useful amounts of power wirelessly to devices within a wireless charging environment. In one embodiment, the wireless charging environment can include various computing devices along the lines of a desktop computer, a laptop computer, net book computer, tablet computer, etc. In some cases, a wireless power supply can be used to provide power wirelessly to various electronic devices such as a smart phone (such as an iPhone™ manufactured by Apple Inc. of Cupertino, Calif.) that include a portable power supply for mobile operation. The power provided by the wireless power supply can be used for operation of the electronic device, charging of a portable power supply within the electronic device, or any combination thereof.

In the described embodiments, efficient wireless non-radiative energy transfer can be accomplished using long-lived oscillatory resonant electromagnetic modes, with localized slowly-evanescent field patterns using the well known principle of resonant coupling (i.e., two same-frequency resonant objects tend to couple, while interacting weakly with other off-resonant environmental objects). More specifically, and, in particular, the resonant coupling is resonant evanescent coupling where the coupling mechanism is mediated through the overlap of the non-radiative near-fields of the two objects. Although it has been well known that energy can be wirelessly efficiently transmitted between coupled objects in the extremely near field (e.g. in optical waveguide or cavity couplers and in resonant inductive electric transformers), in the presently described embodiments, energy is efficiently transferred over mid-range distances that are a few times larger that the largest dimension of both objects involved in the energy transfer (referred to hereinafter as effective distance d). In particular, by establishing a strong coupling, little energy is dissipated to other off-resonant objects. In the described embodiments, a strong coupling between objects can be defined in accordance with Eq. (1):

$$\kappa/\sqrt{\Gamma_1\Gamma_2} \gg 1 \qquad \text{Eq. (1)}$$

where $\Gamma_{1,2}$ are the resonance widths due to the objects' intrinsic (absorption, radiation, etc.) losses, and $\kappa$ is the coupling coefficient.

Consequently, efficient energy transfer requires resonant modes of high $Q=\omega/2\Gamma$ for low (i.e., slow) intrinsic-loss rates $\Gamma$ that characterize evanescent (non-lossy) stationary near-field. Furthermore, strong (fast) coupling rate $\kappa$ is required over distances larger than the characteristic sizes of the objects, and therefore, since the extent of the near-field into the air surrounding a finite-sized resonant object is set typically by the wavelength, the mid-range non-radiative coupling can be achieved using resonant objects of sub-wavelength size, and thus significantly longer evanescent field-tails. Accordingly, the omni-directional but stationary (non-lossy) nature of the near field makes this mechanism suitable for mobile wireless receivers such as electronic devices (either portable or stationary), computing systems, and the like.

Accordingly, efficient wireless power transfer can be well suited for portable applications. As a portability requirement, most portable electronic devices operate on power supplied by a coupled battery supply. The amount of power drawn by the electronic circuits in these devices determines battery life. This imposes an immediate limitation on the usage of these devices, that of recharging the batteries often to keep the devices in operational conditions. For the operational continuity of these devices, users often carry additional batteries. The battery recharging operation is typically dependent on the availability of the electric supply, and to the availability of compatible power sockets. However, in order to obviate these dependencies and inconveniences a wireless power transfer system is provided that at least in part can be used to wirelessly charge batteries. For example, the described wireless power transfer system can provide a power transmitting unit that employs magnetic resonant apparatus and/or other near field power delivery techniques, such as non-radiated magnetic field waves of a target resonant frequency, to power remote devices that are in proximity thereto and capable of receiving power transmitted as non-radiated magnetic fields. In this way, the wireless power transfer system can provide for automatic initiation of battery recharge operations, where recharge can occur without interruption to current operations.

Embodiments of the present embodiment address battery power charging in-situ from a remote power source (station) using magnetic power. This approach of recharging a battery in remote devices is applicable to fairly long distance between a power source and a target device having a rechargeable battery. In some embodiments the wireless delivery of power is conducted through high frequency resonant magnetic coupling between the powers sources resonantly coupled with a target device, the target device being an electronic device that runs on a portable rechargeable battery included therein. Generally, the power source and the target device are tuned to the same frequency. This results in magnetic resonance in the target device for transmitting power wirelessly by the power source with air (or a vacuum for that matter) as the medium for power transfer.

In accordance with one embodiment, the magnetic coupling between a magnetic field generated by a power transmitting unit and a target device enables the power transfer. The magnetic field is directed towards the target device by properly shaping the magnetic generating coil. This system can operate on the transformer principle but with air core and across a greater distance. Also in this setup the power transfer is relatively significant compared to the resonant power transfer using RF electromagnetic signals due relatively close proximity of the power source with the target device and the use of a common frequency between the power transmitting unit and a target device. For example, the system of the present embodiment may use one or more coils disposed in a computing device. The computing device can take the form of a desktop computer along the lines of an iMac™ desktop computer or a portable computer such as a MacBook Pro™ each manufactured by Apple Inc. of Cupertino, Calif. It should be noted that in addition to a discreet coil arrangement, metallic components, such as a housing used to support internal components can also be configured to act as a resonator(s).

For example, at least a portion of the aluminum housing of the iMac™ desktop computer can be used as a resonator. In some cases, a small form factor electronic device, such as an iPhone™ can include a housing at least a portion of which is formed of metal. For example, a metallic band used to provide structural support for the iPhone4™ can be used as a single loop resonator. In this way the metal band can receive power wirelessly for both operating the electronic device and charging the battery, whichever is necessary. In another example, a metallic housing of a peripheral device, such as a mouse, can be used as resonator to provide power for operation of the mouse and/or charging the batteries used to store power for the operation of the mouse. Magnetic signals/fields created by the power source can be received by an antenna/coil of the target device. The received signals/fields charge capacitors through diodes at the target device. An array of such capacitors may be connected in series using a plurality of diodes. This array of capacitors and plurality of diodes helps in rectification of AC (alternating current) to DC (direct current) and may amplify the DC voltage to a value that is sufficient to charge a battery in the target device.

According to an aspect of the present embodiment, the resonant power wireless transmission supports communications at least from the power transmitting unit and the target device. These communications may include information relating to the power charging or other information. Because of the strong wireless coupling between the power transmitting unit and the target device, high data rate communications may be supported by using this technique. For communications from the target device to the power transmitting unit, the same principle may be employed. However, in some embodiments, communications from the target device to the power transmitting unit may be supported by other wireless techniques such as Wireless Local Area Network (WLAN) operations, e.g., IEEE 802.11x, Wireless Personal Area Network operations (WPAN) operations, e.g., Bluetooth, infrared communications, cellular communications and/or other techniques.

In one embodiment, wireless power can be provided by at least one wireless power source having a circularly polarized source resonator. The at least one wireless power source can include a high frequency, orthogonal in-band power transmitter. The at least one wireless power source can include a base plate that provides high frequency (HF) power and at least two "D" shaped resonators. The at least two "D" shaped resonators can be driven about 180° out of phase with each other. Hence, the magnetic fields produced by the at least two "D" shaped resonators can provide a circularly polarized magnetic field. The circularly polarized magnetic field can interact with a peripheral device, such as a mouse, having a corresponding shaped base and resonator antenna. In one embodiment, the peripheral base includes electronic components that can receive power delivered wirelessly from the wireless power source. The electronic components can include a battery that can receive a charging current from the wireless power supply. Due to the circular nature of the polarization of the magnetic field, the resonant coupling between the mouse and the wireless power supply can be substantially unaffected when the mouse is moved upon a surface on which the base plate is supported. It should be noted that the circularly polarized magnetic field can be "steered" by modifying the orientation of the at least two "D" shaped magnetic fields or by modifying the orientation of the axis of the elliptical shaped magnetic field. In one implementation, a target device can take the form of a single orientation receiver.

In one embodiment, a peripheral device can be shaped in such a way to form a resonator having a shape appropriate for interacting with the circularly polarized magnetic field emanating from the wireless power source. For example, a keyboard can have a metal stand used to support the keyboard at an ergonomically friendly angle with respect to a supporting surface. The metal stand can have a shape in accordance with the circularly polarized magnetic field formed by the at least two "D" shaped resonators. In this way, the metal stand can interact with the circularly polarized magnetic field to support wirelessly receiving power from the wireless power source.

In another embodiment, the resonant frequency of the wireless power supply can be tuned and de-tuned to any frequency. The tuning of the resonant frequency can be done dynamically by changing a shape of at least one resonator. In one embodiment, the changing of the shape of the at least one resonator can be carried out using, for example, a piezoelectric shaping techniques. In some embodiments, parasitic capacitance can be used to tune/detune a resonator. In some cases, the wireless power transmitter can vary a center resonance frequency in order to compensate for parasitic capacitance. The dynamic tuning can be used to provide identification of the resonator. For example, when a resonator is detuned (or tuned), resonant impedance associated with the resonator will be removed (or added) to a magnetic circuit between a primary resonator in a power supply and the resonator. The change in resonant impedance can be detected by the power supply and thus that resonator associated with the change in impedance can be deduced and stored for later use.

The dynamic tuning can also be used to arbitrate power amongst a plurality of receiving devices. For example, one or more modes can be tuned in succession followed by a query requesting a confirmation of how much power was received by those devices receiving power at a particular frequency. In this way, resonant modes not equal to the original center frequency can be determined. Hence, maximum power can be transferred at one of the determined resonant frequency. In this way, the most efficient power transfer can occur at the original center frequency but, however, the most amount of power can be transferred at one of the resonant mode frequencies. Resonant modes can be determined by nulling out a particular receiving device, using for example, a backchannel. In this way, the wireless power transmitter can look for a change in impedance when the wireless power transmitter is broadcasting on a resonant mode. In this way, by sweeping through a particular frequency band, a number of resonant modes can be determined. In some cases, resonators can be coupled together to form chained re-resonators.

In another embodiment, conductive material can be used as a waveguide and/or magnetic flux concentrator. In particular, metallic surfaces and structures can be used to guide/concentrate high frequency resonances by, for example, boosting coupling coefficient κ. Conductive surfaces (such as table tops, computer housing, etc.) can be used a flux concentrators as well as metal housings.

In yet another embodiment, a ground comb can be used to preferentially block magnetic flux and preferentially allow other magnetic flux to pass. The ground comb can be formed of magnetically active material in the form of fingers spaced apart to allow at least some magnetic flux to pass through the interstitial spacing. However, at least a second set of fingers can be applied across the first set of fingers for form apertures. The apertures allowing only selected portions and amounts of an incident magnetic field from passing, the remaining portions of the magnetic fields being blocked.

These and other embodiments are discussed below with reference to FIGS. 1-10. However, those skilled in the art will readily appreciate that the detailed description given herein with respect to these figures is for explanatory purposes only and should not be construed as limiting.

FIG. 1 is a block diagram illustrating a wireless power delivery system 100 that includes a power transmitting unit 103 and a target electronic device 115, wherein power is delivered wirelessly employing magnetic waves. The power delivery system 101 is used to deliver electric power to one or more target devices, and the target devices use the delivered power for operation or for recharging a battery or both. The power delivery system 101 includes the power transmitting unit 103, the target electronic device 115, and other target devices capable of receiving power being transmitted. The power transmitting unit 103 includes a power source 105 capable of generating power for power transmission and a sending resonant coupling component 131 capable of power transmission employing magnetic waves 111, such as non-radiated magnetic field waves of a specified target resonant frequency. It also includes a source power manager 107 and a target device authenticator 109. The power transmitting unit 103 is capable of dynamically tuning the power transmission to the target resonant frequency associated with the target electronic device 115, wherein the target resonant frequency is specified dynamically. The power transmitting unit also includes a communication module 110 operable to send a communication signal to the target electronic device 115 via the magnetic waves 111 and/or via Radio Frequency (RF) communications 113. The RF communications 113 may include Wireless Local Area Network (WLAN) communications such as IEEE 802.11x communications, Wireless Personal Area Network (WPAN) communications such as Bluetooth communications, cellular communications, proprietary interface communications, or other RF communication techniques. The communication module 110 may also include a wired communication link, e.g., Local Area Network (LAN) such as Ethernet, Cable Modem, Wide Area Network (WAN) and/or other wired communication means. For example, the wired communication link could provide a high speed uplink to the Internet.

The target electronic device 115 includes a resonant power charging module 117, a user authorization module 121, a source resonant frequency selector 123, a communication module 125, and a target device power manager 127. The resonant power charging module 117 includes a receiving resonant coupling component 141, a power charging controller 119, and a rechargeable battery 129. The receiving resonant coupling component 141, also sometimes referred to as a receiving resonant charging component, is used to receive the power transmissions provided by the power transmitting unit 113 employing the target resonant frequency. The target electronic device 115 employs the received power for operation of the target electronic device 115 as well as for charging the rechargeable battery 129 in the target electronic device 115. The power delivery system 101 employs the sending resonant coupling component 113 of the power transmitting unit 103 to generate magnetic fields that are used to transmit power to the target devices, such as the target electronic device 115. Typically, the sending resonant coupling component 113 includes a resonant coil that fills the space around it with a non-radiated magnetic field oscillating at the target resonant frequency that is received by the target electronic device 115 employing the receiving resonant coupling component 141. The target device also includes a communication module operable 125 to communicate with the communication module 110 of the power transmitting unit 103 via the magnetic coupling and/or via RF communications.

The power transmitting unit 103 that includes the power source 105 and the target electronic device 115 are communicatively coupled with each other during the resonant power delivery from the power source 105 to the target electronic device 115. The resonant coupling is achieved wirelessly using a 'wireless field' 111, which is non-radiated magnetic field in some embodiments. The 'wireless field' 111 are the power delivery channel and a 'wireless link' 113 is the control signal channel. In one embodiment communicating the power and a control signal are conducted employing the same frequency, or in other words, on the same channel, i.e. The wireless field 111. In another embodiment the power link (such as the magnetic field), the control signal, and the normal communication (i.e. The normal function) operation takes place in separate channels. For e.g. The power transmitting unit 103 is implemented in the base station of a mobile phone, where the normal communication operations with the mobile phone (from the base station), resonant power delivery, and the control signal transmission are all conducted between the mobile phone (as a target electronic device) and the base station employing different channels.

The power source 105 is a module which generates the required power to be transmitted in a non-radiated magnetic or radiated magnetic mode, employing an essentially "wireless means" 111. The power source 105 provides power to the sending resonant coupling component 131 which transmits it, for example, creating a non-radiated magnetic field. A source power manager 107 manages the wireless power transmission.

Figure 2:
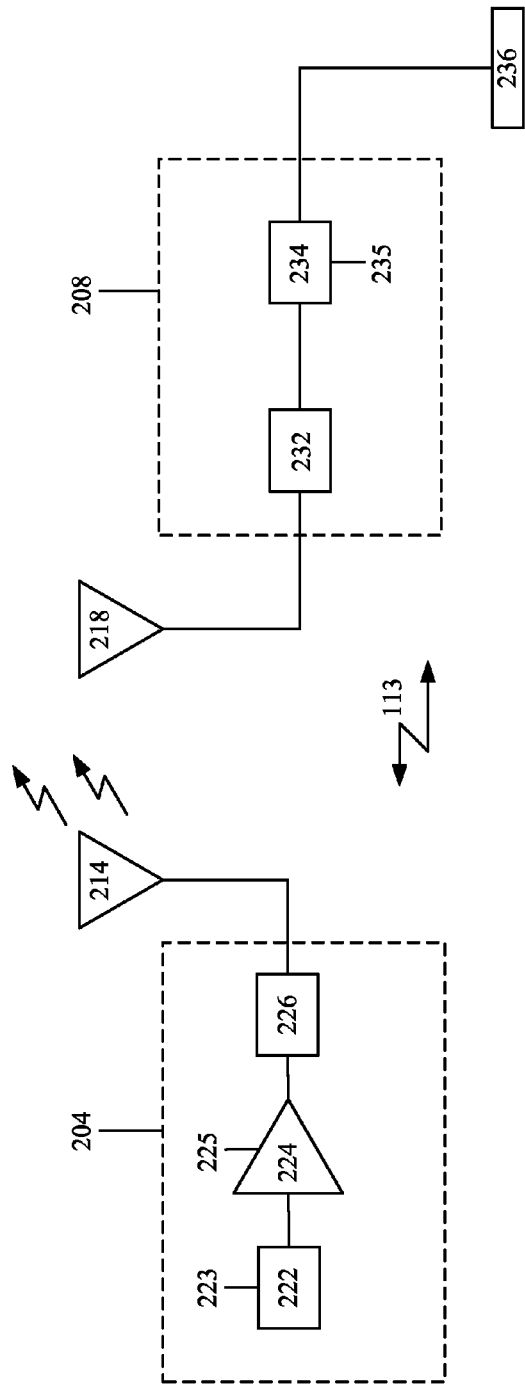
FIG. 2 shows a simplified schematic diagram of a wireless power transfer system.
Figure 3:
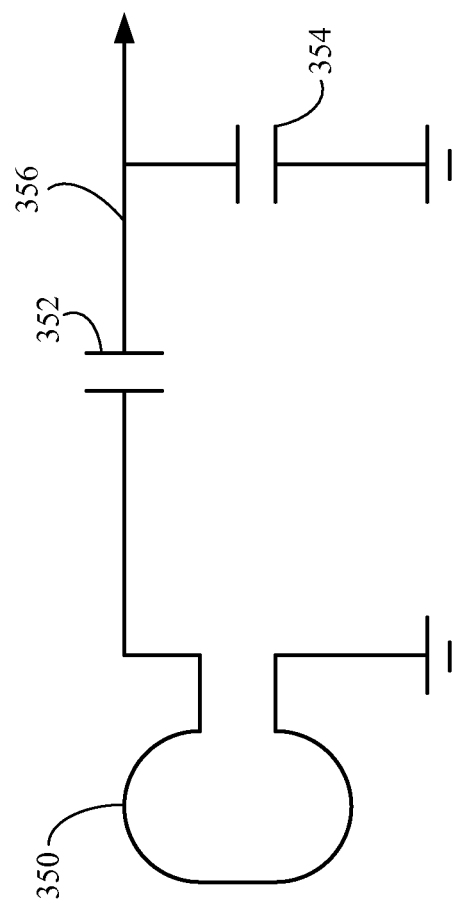
FIG. 3 is a simplified block diagram of a transmitter in accordance with an embodiment.

FIG. 2 shows a simplified schematic diagram of another embodiment 200 of wireless power transfer system 100 described with respect to FIG. 1. Wireless power system 200 can include at least transmitter 204 that, in turn, includes, an oscillator 222, a power amplifier 224 and a filter and matching circuit 226. The oscillator is configured to generate a desired frequency, which may be adjusted in response to adjustment signal 223. The oscillator signal may be amplified by the power amplifier 224 with an amplification amount responsive to control signal 225. The filter and matching circuit 226 may be included to filter out harmonics or other unwanted frequencies and match the impedance of the transmitter 204 to the transmit antenna 214. The receiver 208 may include a matching circuit 232 and a rectifier and switching circuit 234 to generate a DC power output to charge a battery 236 as shown in FIG. 3 or power a device coupled to the receiver (not shown). The matching circuit 232 may be included to match the impedance of the receiver 208 to the receive antenna 218. The receiver 208 and transmitter 204 may communicate on a separate communication channel 113 (e.g., Bluetooth, cellular, WiFi etc).

As illustrated in FIG. 3, antennas used in exemplary embodiments may be configured as a "loop" antenna 350, which may also be referred to herein as a "magnetic" antenna. Loop antennas may be configured to include an air core or a physical core such as a ferrite core. Air core loop antennas may be more tolerable to extraneous physical devices placed in the vicinity of the core. Furthermore, an air core loop antenna allows the placement of other components within the core area. Efficient transfer of energy between the transmitter 104 and receiver 208 occurs during matched or nearly matched resonance between the transmitter 204 and the receiver 208. However, even when resonance between the transmitter 204 and receiver 208 are not matched, energy may be transferred at a lower efficiency. Transfer of energy occurs by coupling energy from the near-field of the transmitting antenna to the receiving antenna residing in the neighborhood where this near-field is established rather than propagating the energy from the transmitting antenna into free space.

The resonant frequency of the loop or magnetic antennas is based on the inductance and capacitance. Inductance in a loop antenna is generally simply the inductance created by the loop, whereas, capacitance is generally added to the loop antenna's inductance to create a resonant structure at a desired resonant frequency. As a non-limiting example, capacitor 352 and capacitor 354 may be added to the antenna to create a resonant circuit that generates resonant signal 356. Accordingly, for larger diameter loop antennas, the size of capacitance needed to induce resonance decreases as the diameter or inductance of the loop increases. Furthermore, as the diameter of the loop or magnetic antenna increases, the efficient energy transfers area of the near-field increases. Of course, other resonant circuits are possible. As another non-limiting example, a capacitor may be placed in parallel between the two terminals of the loop antenna. In addition, those of ordinary skill in the art will recognize that for transmit antennas the resonant signal 356 may be an input to the loop antenna 350.

Figure 4:
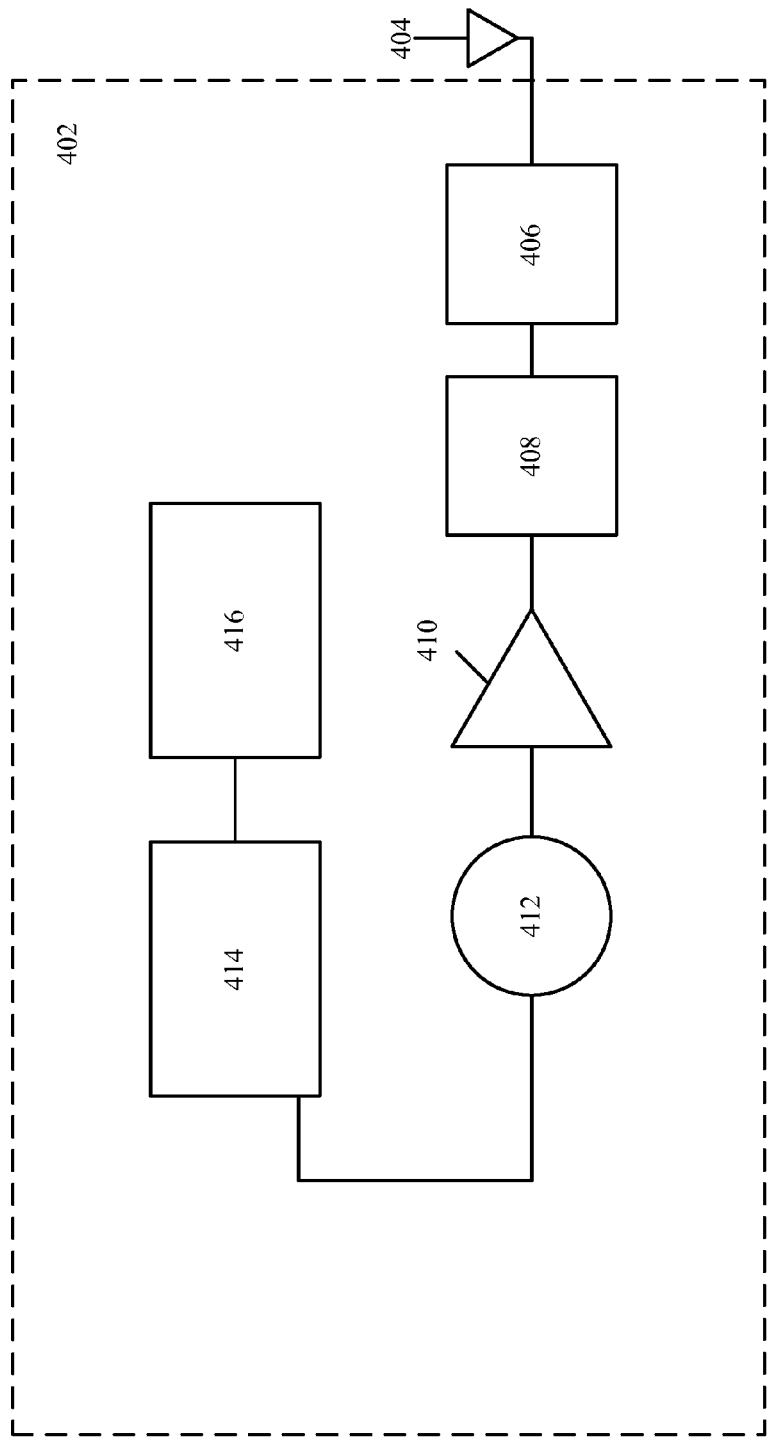
FIG. 4 shows an antenna used in exemplary embodiments may be configured as a "loop" antenna.

FIG. 4 is a simplified block diagram of transmit circuitry 402 and associated transmit antenna 404. Generally, transmit circuitry 402 provides RF power to the transmit antenna 404 by providing an oscillating signal resulting in generation of near-field energy about the transmit antenna 404. By way of example, transmit circuitry 402 may operate at the 13.56 MHz ISM band. Transmit circuitry 402 includes a fixed impedance matching circuit 406 for matching the impedance of the transmit circuitry 402 (e.g., 50 ohms) to the transmit antenna 404 and a low pass filter (LPF) 408 configured to reduce harmonic emissions to levels to prevent self-jamming of devices coupled to receivers 208. Other exemplary embodiments may include different filter topologies, including but not limited to, notch filters that attenuate specific frequencies while passing others and may include an adaptive impedance match, that can be varied based on measurable transmit metrics, such as output power to the antenna or DC current draw by the power amplifier. Transmit circuitry 402 further includes a power amplifier 410 configured to drive an RF signal as determined by an oscillator 412. The transmit circuitry may be comprised of discrete devices or circuits, or alternately, may be comprised of an integrated assembly. An exemplary RF power output from transmit antenna 404 may be on the order of 2.5 to 8.0 Watts.

Transmit circuitry 402 further includes a controller 414 for enabling the oscillator 412 during transmit phases (or duty cycles) for specific receivers, for adjusting the frequency of the oscillator, and for adjusting the output power level for implementing a communication protocol for interacting with neighboring devices through their attached receivers. The transmit circuitry 402 may further include a load sensing circuit 416 for detecting the presence or absence of active receivers in the vicinity of the near-field generated by transmit antenna 404. By way of example, a load sensing circuit 416 monitors the current flowing to the power amplifier 410, which is affected by the presence or absence of active receivers in the vicinity of the near-field generated by transmit antenna 404. Detection of changes to the loading on the power amplifier 410 are monitored by controller 414 for use in determining whether to enable the oscillator 412 for transmitting energy to communicate with an active receiver.

Transmit antenna 404 may be implemented as an antenna strip with the thickness, width and metal type selected to keep resistive losses low. In a conventional implementation, the transmit antenna 404 can generally be configured for association with a larger structure such as a table, mat, lamp or other less portable configuration. Accordingly, the transmit antenna 404 generally will not need "turns" in order to be of a practical dimension. An exemplary implementation of a transmit antenna 404 may be "electrically small" (i.e., fraction of the wavelength) and tuned to resonate at lower usable frequencies by using capacitors to define the resonant frequency. In an exemplary application where the transmit antenna 404 may be larger in diameter, or length of side if a square loop, (e.g., 0.50 meters) relative to the receive antenna, the transmit antenna 404 will not necessarily need a large number of turns to obtain a reasonable capacitance. Transmit circuitry 402 may gather and track information about the whereabouts and status of receiver devices that may be associated with the transmit circuitry 402. Thus, the transmitter circuitry 402 may include a presence detector, an enclosed detector, or a combination thereof, connected to the controller 414 (also referred to as a processor herein).

Figure 5:
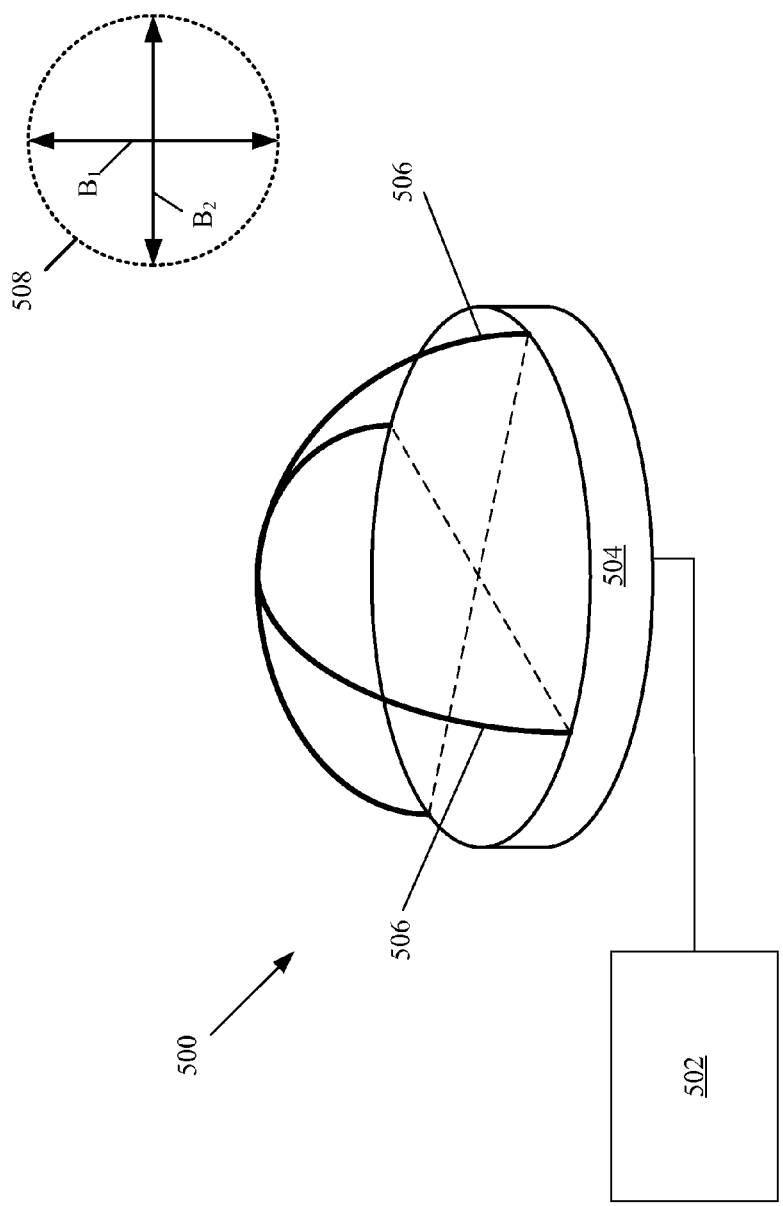
FIG. 5 shows wireless power source arranged to transfer power utilizing a circularly polarized magnetic field in accordance with the described embodiments.

In one embodiment, wireless power can be provided by at least one wireless power source having a circularly polarized source resonator. More specifically, FIG. 5 shows wireless power source 500 arranged to transfer power utilizing a circularly polarized magnetic field in accordance with the described embodiments. Wireless power source 500 can include power supply 502. In the described embodiment, power supply 502 can take the form of high frequency, orthogonal in-band power transmitter that can supply high frequency (HF) power to base plate 504. Base plate 504, in turn, provides HF power to resonators 506 that can take the form of "D" shaped resonators. In this way, each of the "D" shaped resonators 506 can act as a circular polarized magnetic field source resonator that can convert at least some of the HF power provided to base plate 504 to separate component magnetic fields $B_1$ and $B_2$ that can combine with each other to form resulting magnetic field 508. In a particularly useful configuration, the at least two "D" shaped resonators 506 can be driven by base plate 504 about 180° out of phase with each other such that the resulting component magnetic fields $B_1$ and $B_2$ are also 180° out of phase with each other. The combining of the two out of phase component magnetic fields $B_1$ and $B_2$ can result in a resulting magnetic field that is circularly polarized. It should be noted that with a circularly polarized magnetic field, the plane of polarization rotates in a corkscrew pattern, making one complete revolution during each wavelength. In this way, a circularly polarized wave radiates energy in both the horizontal and vertical planes and all planes in between. If the rotation is clockwise looking in the direction of propagation, the sense is called right-hand-circular (RHC). If the rotation is counterclockwise, the sense is called left-hand circular (LHC). In this way, resulting circularly polarized magnetic field 508 can be transmitted in all planes, making it more likely for a mobile device (such as a computer mouse) to be able to establish a reliable resonance link regardless of the relative antenna orientation of the mobile device and wireless power supply 500.

Figures 6A, 6B:
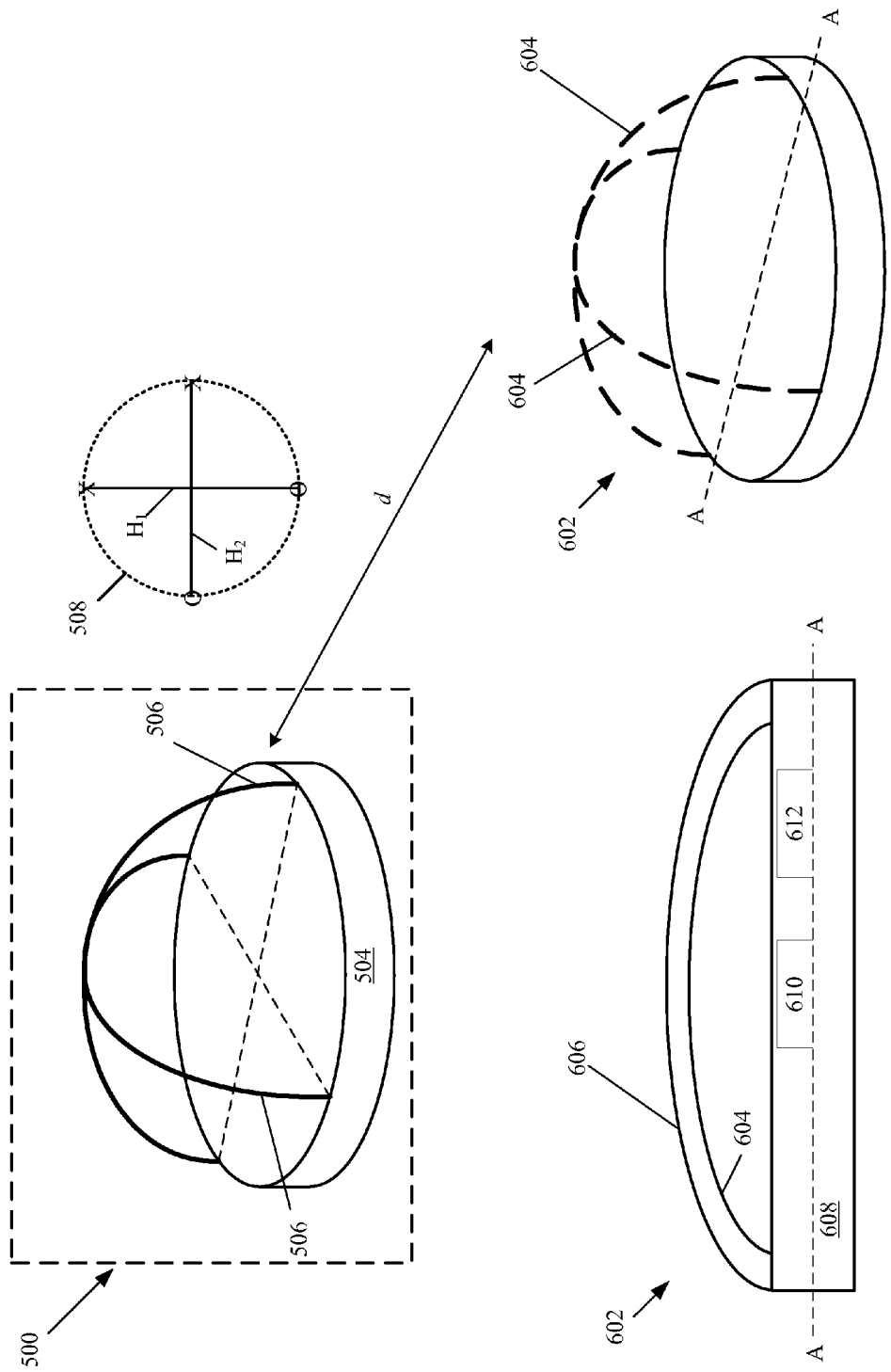
FIGS. 6A-6E illustrate a basic configuration of a wireless system in accordance with the described embodiments.

FIGS. 6A-6E illustrates a basic configuration of wireless system 600 that includes wireless power supply 500 arranged to radiate circularly polarized magnetic field 508 in accordance with the described embodiments. In particular, FIG. 6A shows that a resonant channel can be formed between wireless power supply 500 and peripheral device 602. Peripheral device 602 can be configured as a mobile device that can be moved to any position within effective distance d of wireless power supply 500. Effective distance d can represent a distance from wireless power supply 500 over which a useful amount of power can be received by peripheral device 602 from wireless power supply 500. Effective distance d can range from a few centimeters to a few meters. It should be noted that effective distance d can be affected by many factors in addition to the size and shape of resonators 504 and the size and shape of resonators 604 included in peripheral device 602. In any case, the presumption for the remainder of this discussion is that peripheral device 602 remains within maximum distance $d_{max}$ of wireless power supply 500 by maintaining a current distance from wireless power supply 500 that is less than distance $d_{max}$ at all times. It should be noted that maximum distance represents that area around power supply 500 where a minimum pre-determined amount of power $P_{min}$ can be wirelessly received at peripheral device 602 from power supply 500. For example power $P_{min}$ can be set at 20 mW representing the least amount of power that can be transferred to peripheral device 602 in order for peripheral device 602 to operate in a fully operable manner. Of course, depending upon a current status of on-board power supplies (if any) power $P_{min}$ can vary thereby altering effective range D of power supply 500.

Resulting magnetic field 508 can be formed by combining component magnetic fields $B_1$ and $B_2$ generated by resonators 504 in wireless power supply 500. In this embodiment, peripheral device 602 can take the form of computer mouse 602. Computer mouse 602 can include resonators 604 each having a shape factor associated with resonators 506 included in wireless power supply 500. In other words, resonators 604 can also be "D" shaped. In this way, the interaction of "D" shaped resonators 604 can be optimized for the most efficient wireless power transmission. In addition to providing an efficient wireless power transfer, the circular polarized nature of resulting magnetic field 508 allows computer mouse 602 to maintain any spatial orientation on a supporting surface or in free space and still maintain an essentially constant power transfer between wireless power supply 500 and computer mouse 602 (as shown below).

Accordingly, FIG. 6B shows cross section of peripheral device 602 along line AA illustrating housing 606 coupled to base portion 608. In particular, housing 606 can enclose resonators 604 electrically coupled to battery 610 and operational components 612 in base portion 608. In this way, battery 610 and operational components 612 can receive a relatively constant supply of power from wireless power supply 500 by way of resonators 604. It should be noted that in some embodiments, battery 610 is not necessary as power can be received wirelessly from wireless power supply 500 thereby obviating the need for any on-board power supply.

Figure 6C:
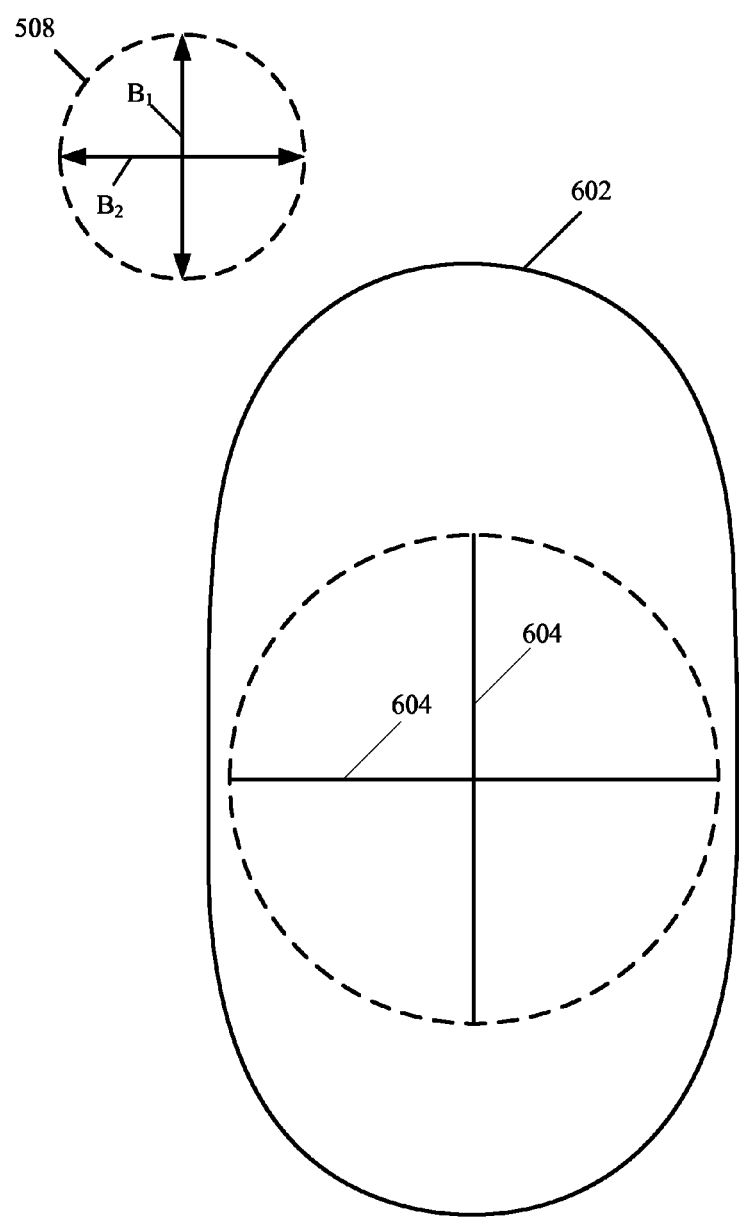
Figure 6D:
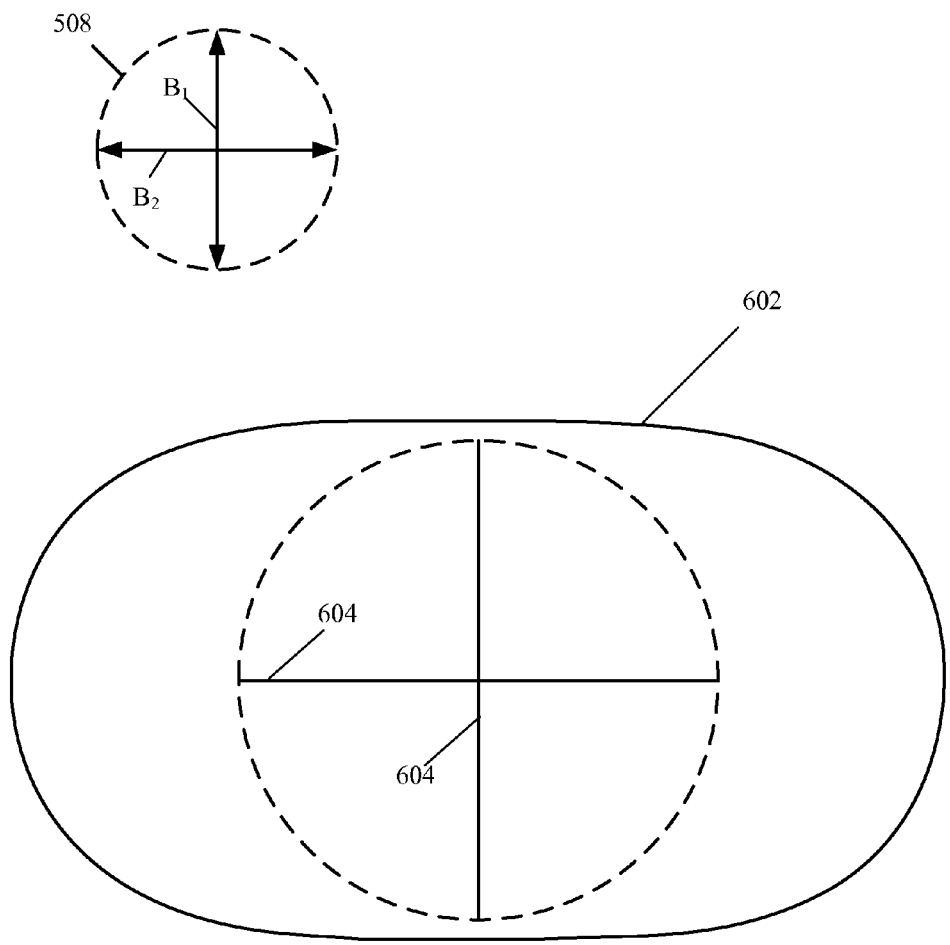
Figure 6E:
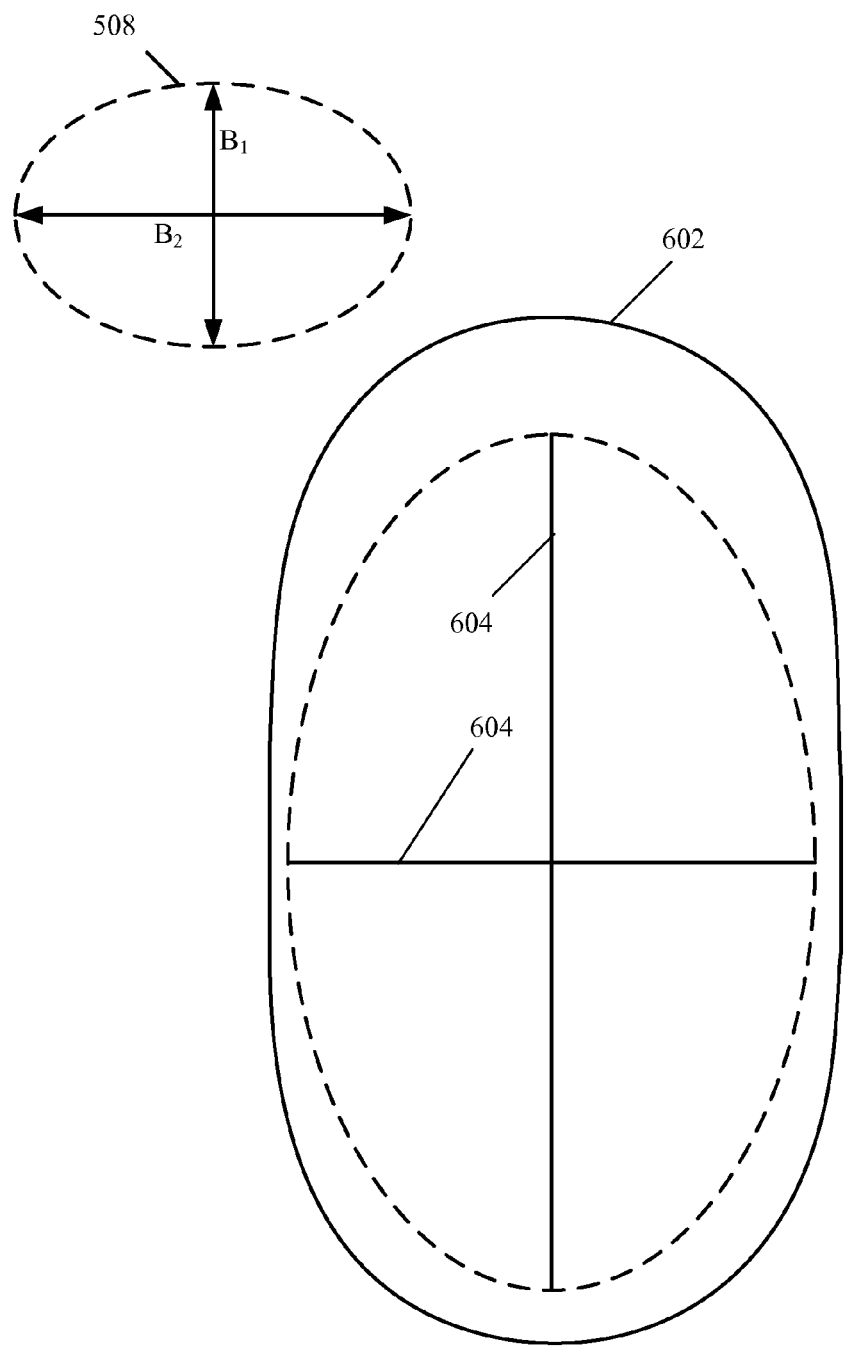

As seen in FIGS. 6C-6E, the symmetry of magnetic field 508 provides that power can be wirelessly received at peripheral device 602 at acceptable levels regardless of the orientation of peripheral device 602. For example, as shown in FIG. 6C, peripheral device 602 in the form of mouse 602 can include resonators 604 that are substantially equal in size and at about right angles to each other. In this way, the geometry of resonators 604 can be tuned to the properties of circularly polarized magnetic field 508. Due to the matching symmetry between circularly polarized magnetic field 508 and resonators 604, power from power supply 500 can be received at or above an acceptable level regardless of the spatial orientation of computer mouse 602 with respect to power supply 500 (and more particularly resonators 504). As further illustrated in FIG. 6D, peripheral device 602 can be rotated about ninety degrees from the orientation shown in FIG. 6C and still maintain an advantageous orientation with respect to resonators 506 in power supply 500 and resonators 604 in computer mouse 602.

It should be noted that the magnetic field provided by power supply 500 can in fact take on an elliptical shape (a circle being a special case of an ellipse) as illustrated in FIG. 6E. Accordingly, resonators 604 in peripheral device 602 can also take on a corresponding elliptical shape thereby optimizing an amount of power transferred from power supply 500 to peripheral device 602 as well as optimizing the power transfer efficiency. It should be noted that circularly polarized magnetic field 508 can be "steered" by modifying the orientation of the at least two "D" shaped magnetic fields generated by "D" shaped resonators 506 for example, by modifying the orientation of the axes of the elliptical shaped magnetic field. It should be noted that in one implementation, the target device (which in this representation takes the form of a computer mouse) can include only a single orientation receiver that although reduces the rate of power transfer that can be achieved from using more than one resonator, but nonetheless may be a suitable solution when available space or size is a significant consideration.

Figure 7:
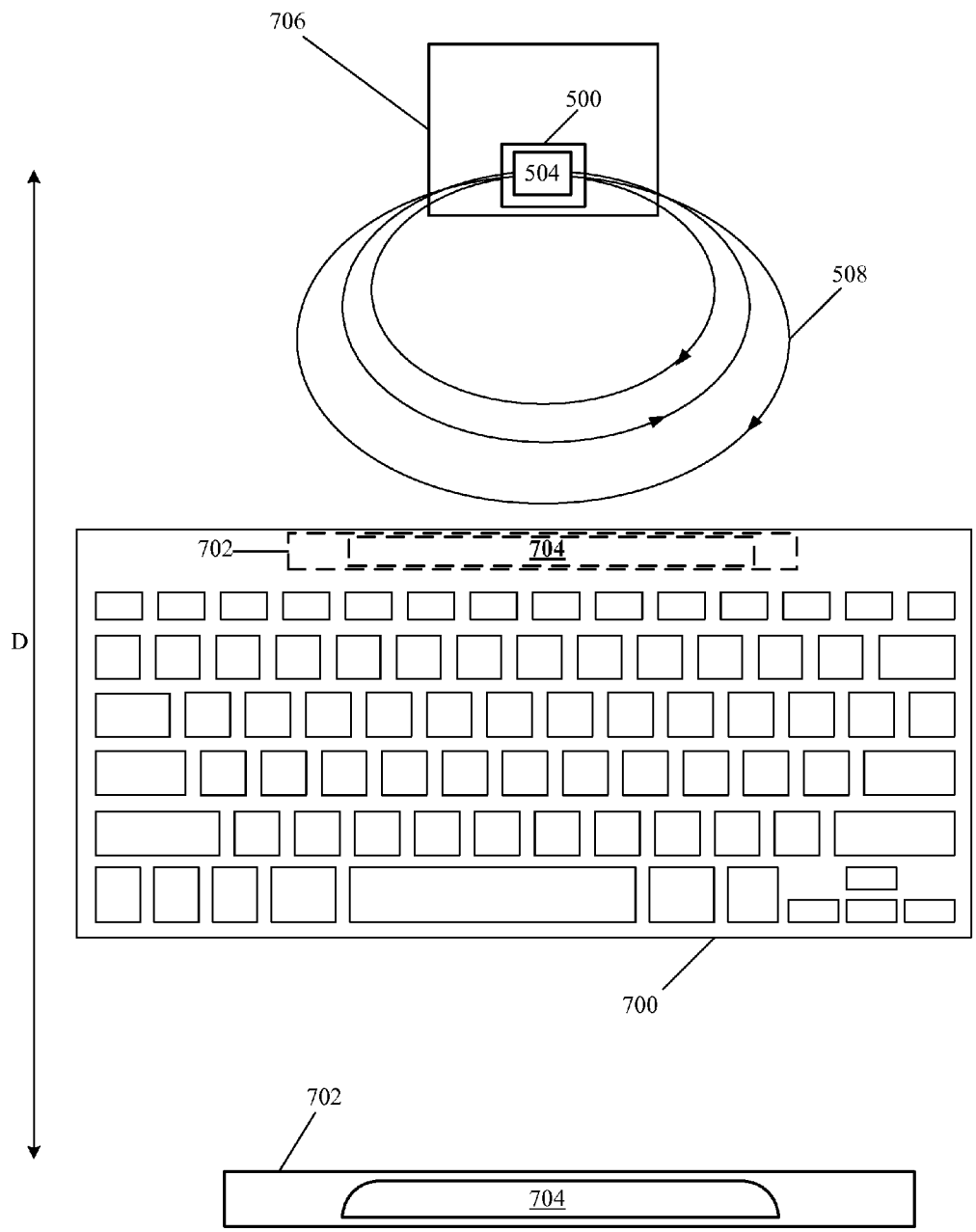
FIG. 7 illustrates an embodiment whereby peripheral device takes on the form of keyboard within effective range D of a wireless power supply.

FIG. 7 illustrates an embodiment whereby peripheral device 602 takes on the form of keyboard 700 within maximum range D of wireless power supply 500. In particular, FIG. 7 shows a top view of keyboard 700 having wireless power receiver unit 702 incorporated as part of the structure of keyboard 700. For example, keyboard 700 can be formed of metal such as aluminum. Wireless power receiver unit 702 can include at least one resonator 704. In a particular embodiment, resonator 704 can take the form of a "D" shaped resonator matching resonator 504 in wireless power supply 500. In this way, keyboard 700 can wirelessly receive power by way of circularly polarized magnetic field 508 regardless of the orientation of keyboard 700 with respect to wireless power supply 500. It should be noted, however, that in some situations, wireless power supply 500 can be incorporated in another device, such as computing system 706. In this situation, the actual spatial orientation of keyboard 700 with respect to computing system 706 is quite limited (unlike that of a computer mouse). Therefore, resonator 704 can be limited to a single "D" shaped resonator that can be fabricated as part of keyboard 700 without significant adverse effect on the ability of keyboard 700 from receiving at least an amount of power sufficient for full operation of keyboard 700.

Figure 8A:
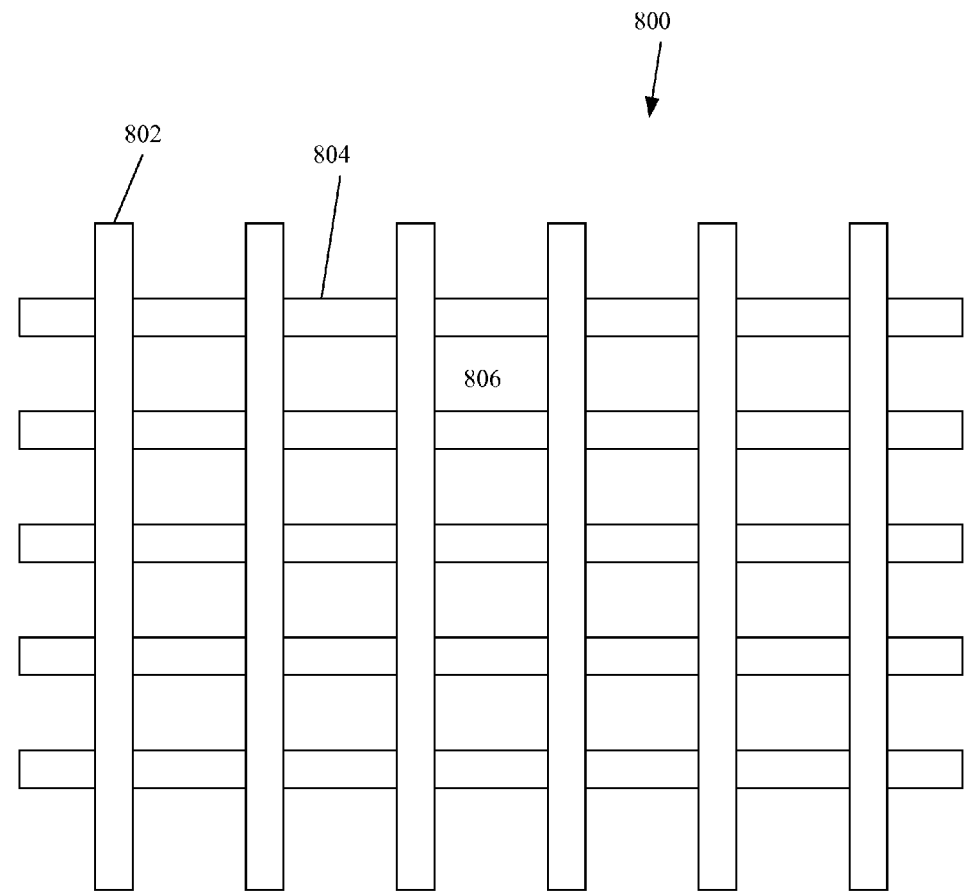
FIGS. 8A and 8B show a magnetic ground comb in accordance with the described embodiments.
Figure 8B:
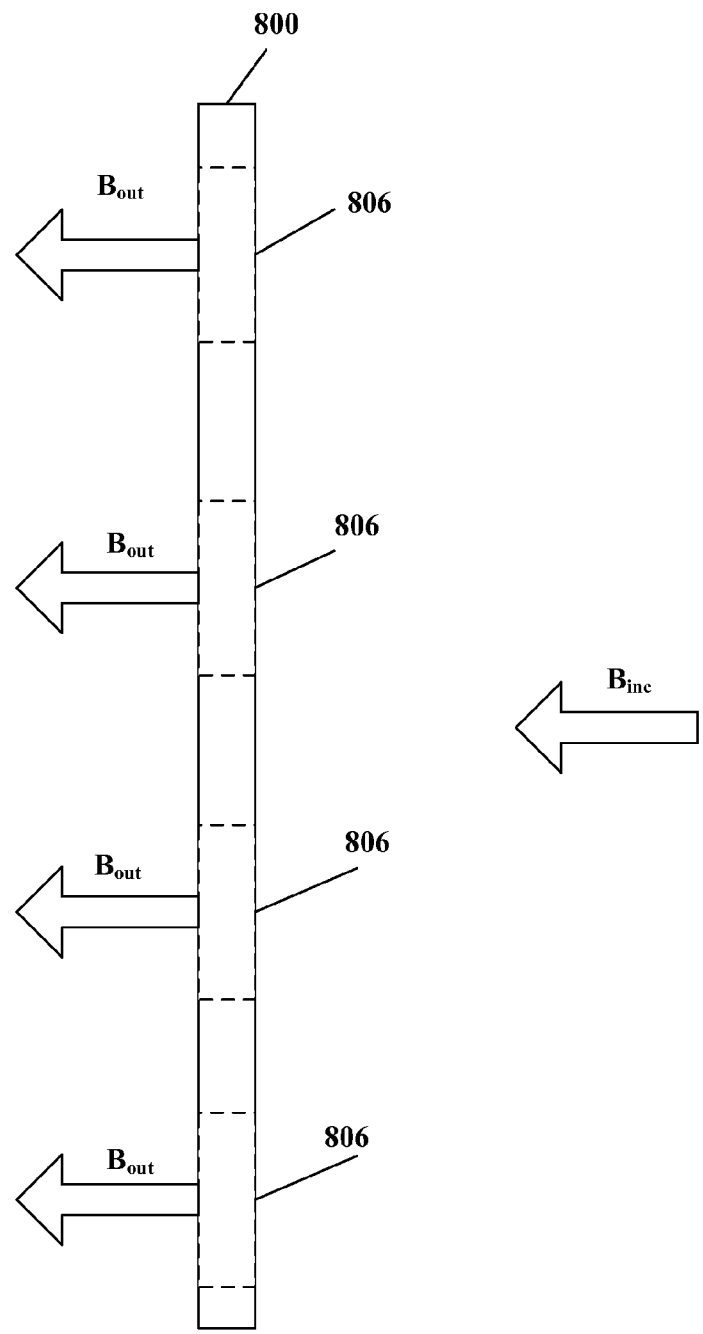

In yet another embodiment, ground comb 800 as shown in FIG. 8A can be used to selectively block some magnetic flux and preferentially allow other magnetic flux to pass. Ground comb 800 can be formed of magnetically active material in the form of first set of fingers 802 spaced apart to allow at least some magnetic flux B to pass through interstitial spacing. However, at least second set of fingers 804 can be applied across first set of fingers 802 for form apertures 806. Apertures 806 are configured to allow only selected portions and amounts of incident magnetic field $B_{inc}$ to pass through as magnetic field $B_{out}$, the remaining portions of incident magnetic field $B_{inc}$ being blocked as shown in FIG. 8B.

It should be noted that by varying the geometry of the resonators, the resonant frequency of the wireless power supply can be tuned and de-tuned to any frequency. In one embodiment, the tuning of the resonant frequency can be done dynamically by changing a shape of at least one resonator. In one embodiment, the changing of the shape of the at least one resonator can be carried out using, for example, a piezoelectric shaping techniques. In some embodiment, parasitic capacitance can be used to tune/detune a resonator. In some cases, the wireless power transmitter can vary a center resonance frequency in order to compensate for parasitic capacitance.

Figure 9:
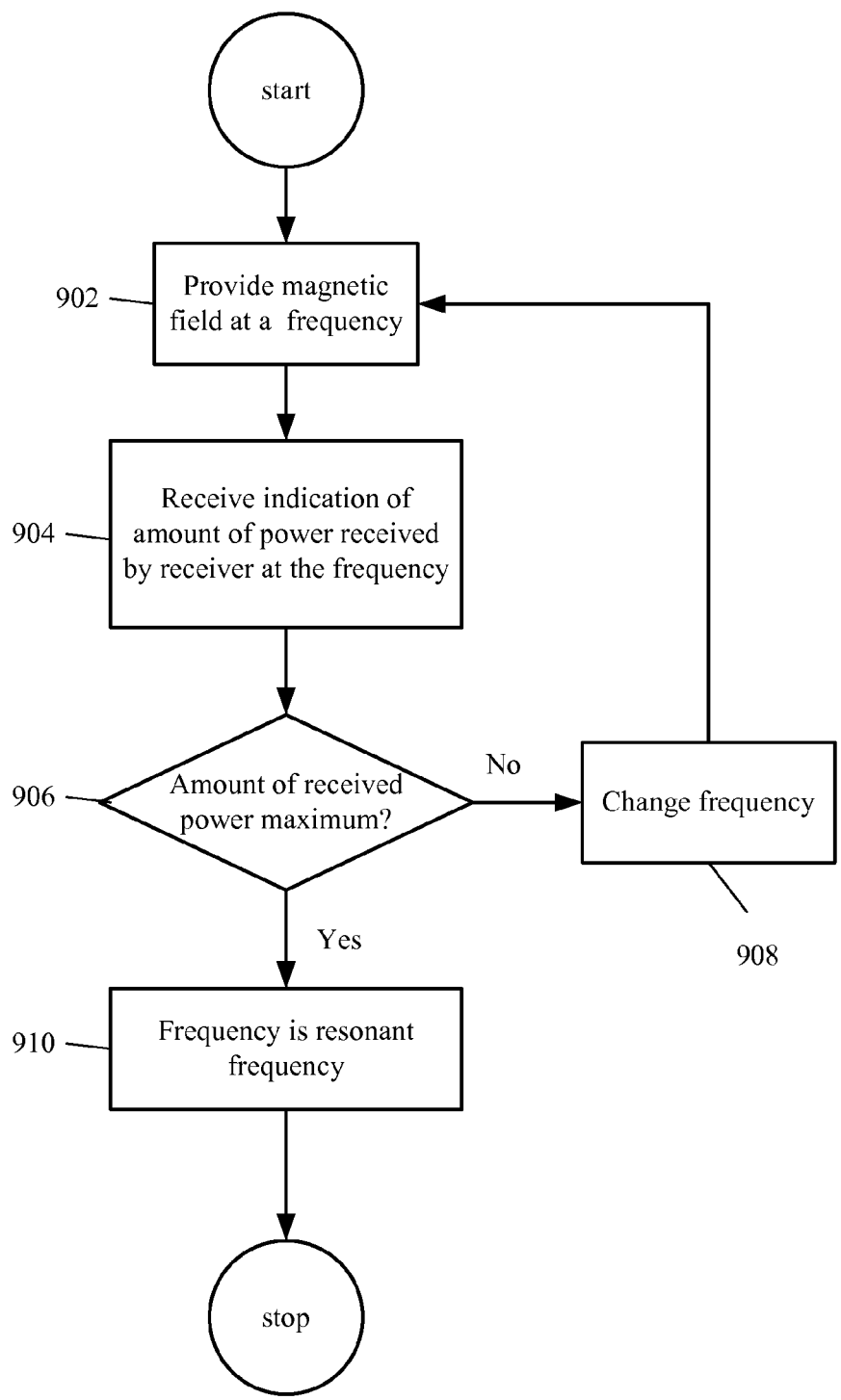
FIG. 9 shows a flowchart detailing process in accordance with the described embodiments.

In particular, FIG. 9 shows a flowchart detailing process 900 for determining a resonant frequency of a magnetic power transfer system in accordance with the described embodiments. Process 900 can begin at 902 by providing a magnetic field at a frequency. In the described embodiment, the frequency of the magnetic field can be based at least in part upon the characteristic sizes of the constituents of the magnetic power transfer system. For example, the characteristic size of the power resonator as well as any of the receiving resonators can be used to determine the magnetic field frequency. In addition to the characteristic size, the amount of power to be transferred can also affect the frequency as more power may require a higher frequency. One the magnetic field has been provided at the frequency, an indication of an amount of power wirelessly received at a receiver is obtained at 904. The indication can be obtained using a communication channel (sometimes referred to as a back channel) using any suitable manner of communication such as WiFi™, Bluetooth, and so on. Once the indication of the amount of power received has been obtained, a determination is made at 906 if the amount of power received is indicative of a maximum power. The determination can be based upon a pre-determined power amount that has been designated as a maximum power for the particular system or the determination can be based upon a comparison of previous indications of received power.

In any case, if it is determined that the received amount of power is not maximum, then the frequency is updated at 908 and control is passed back to 902. The updating of the frequency can be accomplished in many ways. For example, the frequency can be updated by varying the geometry of the resonators. In this way, the resonant frequency of the wireless power supply can be tuned and de-tuned to any frequency. In one embodiment, the tuning of the resonant frequency can be done dynamically by changing a shape of at least one resonator. In one embodiment, the changing of the shape of the at least one resonator can be carried out using, for example, a piezoelectric shaping techniques. In some embodiment, parasitic capacitance can be used to tune/detune a resonator. In some cases, the wireless power transmitter can vary a center resonance frequency in order to compensate for parasitic capacitance. On the other hand, if the power received is determined to be maximum, that at 910 the frequency is the resonant frequency and process 900 ends.

The dynamic tuning can also be used to arbitrate power amongst a plurality of receiving devices. For example, one or more nodes can be tuned in succession followed by a query requesting a confirmation of how much power was received by those devices receiving power at a particular frequency. In this way, resonant modes not equal to the original center frequency can be determined. Hence, maximum power can be transferred at one of the determined resonant frequency. In this way, the most efficient power transfer can occur at the original center frequency but, however, the most amount of power can be transferred at one of the other resonant mode frequencies. Resonant modes can be determined by nulling out a particular receiving device, using for example, a back-channel. In this way, the wireless power transmitter can look for a change in impedance when the wireless power transmitter is broadcasting on a resonant mode. In this way, by sweeping through a particular frequency band, a number of resonant modes can be determined. In some cases, resonators can be coupled together to form chained re-resonators.

Figure 10:
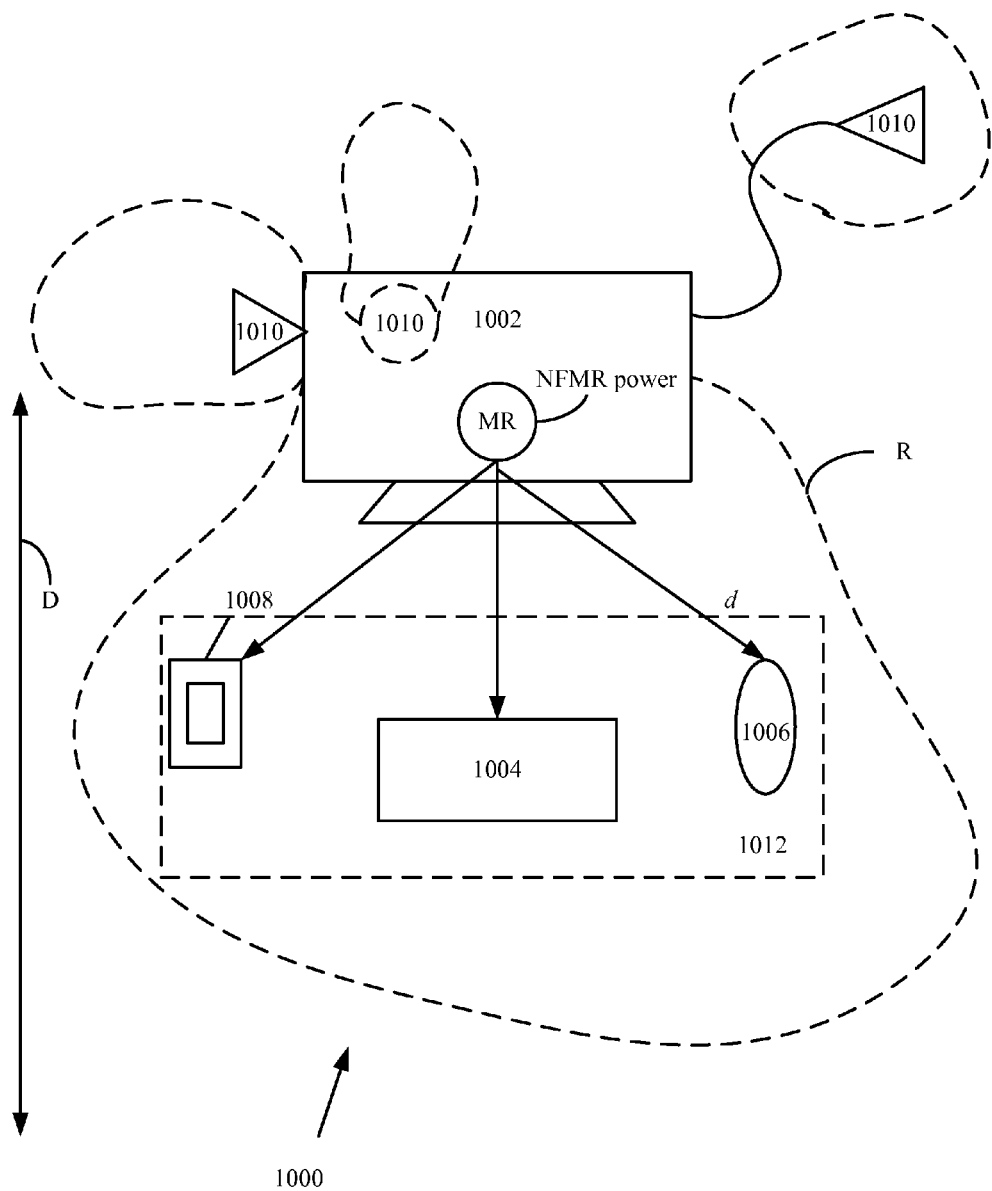
FIG. 10 shows a representative wireless local computing environment in accordance with the described embodiments.

FIG. 10 shows representative virtual charging area 1000 in accordance with the described embodiments. Virtual charging area 1000 provides region R of charging for suitably configured devices placed within the region R. NFMR power supply can be placed in central unit such as desktop computer. In this way, the desktop computer can provide the NFMR power supply with computing resources. It should be noted that the near field magnetic resonance (NFMR) power supply can include high Q circuit that relies upon near field magnetic coupling by way of a resonance channel formed between resonances of the power source and sink to transfer power. The NFMR power supply can be a standalone unit such as, for example, included in a desk top computer, laptop computer, tablet computer, and so on. In other embodiments, the NFMR power supply can take the form of a portable type unit such as a dongle that can be connected to a legacy device such as a desktop computer thereby providing the ability to retrofit devices. In still other embodiments, housing or a portion of a housing used to enclose the NFMR power source can act to extend a useful range of the NFMR power supply.

In this way, suitably configured peripheral devices can be powered directly from the NFMR power supply. In so doing, the peripheral devices when tuned to the appropriate frequency can receive power wirelessly from the NFMR power supply. In so doing, the appropriately tuned peripheral device can be considered to be part of a resonance circuit that can include the NFMR power supply and any other peripheral devices so tuned. As part of such a circuit, each device has associated with it a corresponding load that can be sensed by the NFMR power supply. As such, the resonance circuit can have a characteristic load that can change by the addition or deletion of devices from the resonance circuit. For example, if a suitably configured device such as a portable media player is brought within range of the NFMR power supply, then the load associated with the portable media player can be sensed by the NFMR power supply when (and if) the portable media player is appropriately tuned. It should be noted that in some cases, the device being brought into the range of the NFMR power supply can communicate its initial presence using a standard communication protocol such as WiFi or Bluetooth. However, once incorporated into the resonance circuit, the device can use a communication back channel described in detail below. Accordingly, any change in the characteristic load factor of the resonance circuit can convey information that can be used by the NFMR power supply to control the various devices in the resonance circuit by, for example, distributing power, and so on.

In some embodiments, certain of the peripheral devices can be configured to include a re-resonator circuit that can receive power directly from the NFMR power supply. Such devices can also transfer a portion of the power received to other of the peripheral devices. Virtual charging area 1000 includes central unit 1002 (desktop computer) that can include the NFMR power supply, keyboard 1004, mouse 1006, and portable media player 1008. In one embodiment, keyboard 1004 can be configured to receive power directly from the NFMR power supply included in desktop computer 1002 as can mouse 1006 and portable media player 1008.

In some cases, the ability of desktop computer 1002 to provide power directly to mouse 1006, for example, can be reduced due to any number of factors. Such factors can include, for example, the addition of other devices into region R that require power from the NFMR power supply, obstacles interfering with the direct power channel formed between the NFMR and mouse 1006, and so on. In this case, keyboard 1004 can act as a re-resonator such that a portion of the power delivered to keyboard 1004 from the NFMR power supply can be passed on by way of a re-resonator transmission unit (not shown) in keyboard 1004. In this way, any power loss experienced by mouse 1006 can be ameliorated by the power received from keyboard 1004. This arrangement can be transitory or can last for as long as mouse 1006 is not able to receive adequate power directly from the NFMR power supply. In other cases, the locating of portable media player 1008 within region R can reduce the amount of power available to keyboard 1004 and mouse 1006. In this case, if a battery in keyboard 1006 is fully charged (or additional charge is not necessary) then keyboard 1006 can decouple a charging circuit while still maintaining a re-resonator circuit providing power to mouse 1006.

It should be noted that conductive material 1012 can be used as a waveguide and/or magnetic flux concentrator. In particular, metallic surfaces and structures can be used to guide/concentrate high frequency resonances by, for example, boosting coupling coefficient k. Conductive surfaces (such as table tops, computer housing, etc.) can be used a flux concentrators as well as metal housings.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The computer readable medium is defined as any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

The advantages of the embodiments described are numerous. Different aspects, embodiments or implementations can yield one or more of the following advantages. Many features and advantages of the present embodiments are apparent from the written description and, thus, it is intended by the appended claims to cover all such features and advantages of the invention. Further, since numerous modifications and changes will readily occur to those skilled in the art, the embodiments should not be limited to the exact construction and operation as illustrated and described. Hence, all suitable modifications and equivalents can be resorted to as falling within the scope of the invention.

What is claimed is:

1. A near field magnetic resonance (NFMR) power supply arranged to use a resonance channel to transfer energy to resonance circuits within a near field distance D, the distance D defining an outermost range of the NFMR power supply, comprising:

a high frequency (HF) power source for providing a high frequency, orthogonal in-band power;

a base plate that provides high frequency (HF) power coupled to the HF power source; and at least two "D" shaped resonators arranged to receive HF power from the base plate, wherein the least two D shaped resonators are driven 180° out of phase with each other, wherein the magnetic fields produced by the at least two D shaped resonators are arranged to provide a symmetric magnetic field at a resonant frequency.

2. The NFMR power supply as recited in claim 1, wherein the symmetric magnetic field is circularly polarized.

3. The NFMR power supply as recited in claim 1, wherein power is wirelessly transferred from the NFMR power supply to a peripheral device in resonance with the circularly polarized magnetic field at the resonant frequency.

4. The NFMR power supply as recited in claim 3, the peripheral device comprising:

a base arranged to enclose and support at least operating components and a battery, and and a resonator structure electrically coupled to the battery having a size and shape in accordance with the at least two D shaped resonators.

5. The NFMR power supply as recited in claim 4, further comprising:

a central processing unit arranged to provide processing resources to the NFMR power supply; and a housing, at least a portion of the housing being formed of metal and used as a re-resonator arranged to re-resonate the circularly polarized magnetic field from the D shaped resonators to the peripheral device wherein the portion of the housing used as the re-resonator is configurable to adjust the resonant frequency.

6. The NFMR power supply as recited in claim 5, the peripheral device further comprising:

a processor;

a dynamically tunable resonance circuit in communication with the processor suitably adapted to receive power wirelessly from the NFMR power supply, wherein the processor directs the resonance circuit to tune at least one of the resonance frequencies of the NFMR power supply.

7. The NFMR power supply as recited in claim 6, where the peripheral device provides an identification to the NFMR power by the processor directing the tunable resonance circuit to subsequently de-tune thereby altering a resonance circuit load factor.

8. The NFMR power supply as recited in claim 7, wherein the change in resonance circuit load factor is detected by the NFMR power supply and is used by the NFMR power supply processor to provide a device identification of the de-tuned peripheral device.

9. The NFMR power supply as recited in claim 8, wherein the NFMR power is dynamically tuned by changing a shape of at least one of the D shaped resonators.

10. The NFMR power supply as recited in claim 9, wherein the shape of the at least one of the D shaped resonators is carried out using a piezoelectric shaping mechanism.

11. The NFRM power supply as recited in claim 10, wherein the resonant frequency of the NFMR power supply is dynamically tuned by varying a center resonance frequency to compensate for parasitic capacitance.

12. The NFMR power supply as in claim 1 wherein the at least two "D" shaped resonators are arranged to provide an elliptically polarized magnetic field.

13. The NFMR power supply as in claim 12 wherein the at least two "D" shaped resonators are configured to modify the orientation of the axes of the magnetic fields produced by the at least two "D" resonators.

14. The NFMR power supply as in claim 1 further comprising
 a transmit circuit to generate a near field energy;
 an antenna to transmit the near field energy; and
 an impedance matching circuit to match an impedance of the transmit circuit to an impedance of the antenna.

15. The NFMR power supply as in claim 14 further comprising a low pass filter to reduce a harmonic emission from the antenna.

16. The NFMR power supply as in claim 1 further comprising a ground comb in proximity to the at least two "D" shaped resonators to preferentially block a magnetic flux.

17. The NFMR power supply as in claim 16 wherein the ground comb further comprises:
 a first plurality of magnetically active elements, and
 a second plurality of magnetically active elements arranged in relation to the first plurality of magnetically active elements to form at least one aperture, wherein the first and second plurality of magnetically active elements permit transmission of an incident magnetic field through the ground comb only at the apertures.

18. The NFMR power supply as in claim 3 wherein the peripheral device comprises a magnetic flux concentrator arranged to increase a local magnetic flux of the symmetric magnetic field.

19. The NFMR power supply as in claim 1 wherein the HF power source is arranged to modify an effective range of the NFMR by adjusting the orthogonal in-band power.

20. The NFMR power supply as in claim 3 wherein the peripheral device is one of a group of peripheral devices at least one of which is a keyboard and at least another is a mouse.

21. The NFMR power supply as recited in claim 20, wherein at least one of the peripheral devices includes a re-resonator circuit, the re-resonator circuit arranged to wirelessly provide a portion of the power received by the peripheral device from the NFMR power supply to the another peripheral device.

* * * * *

UNITED STATES PATENT AND TRADEMARK OFFICE
CERTIFICATE OF CORRECTION

PATENT NO. : 8,598,747 B2  Page 1 of 1
APPLICATION NO. : 13/989047
DATED : December 3, 2013
INVENTOR(S) : Brett C. Bilbrey et al.

It is certified that error appears in the above-identified patent and that said Letters Patent is hereby corrected as shown below:

In the Specification

Column 1: DELETE Lines 27 to 63 - (specifically, delete the text beginning "Energy or power may be transferred..." to and ending "near-field energy transfer scheme.")

Signed and Sealed this
First Day of July, 2014

Michelle K. Lee
*Deputy Director of the United States Patent and Trademark Office*

(12) SUPPLEMENTAL EXAMINATION CERTIFICATE

United States Patent
Bilbrey et al.

(10) Number: US 8,598,747 F1
(45) Certificate Issued: Jun. 10, 2014

Control No.: 96/000,063
Primary Examiner: Jason Proctor

Filing Date: Apr. 24, 2014

No substantial new question of patentability is raised in the request for supplemental examination. See the Reasons for Substantial New Question of Patentability Determination in the file of this proceeding.

(56) Items of Information

OTHER DOCUMENTS

Karalis et al., "Efficient wireless non-radiative mid-range energy transfer." Annals of Physics 323, pp. 34-48 (2008)

(12) SUPPLEMENTAL EXAMINATION CERTIFICATE
United States Patent
Bilbrey et al.

(10) Number: US 8,598,747 F2
(45) Certificate Issued: Jul. 17, 2014

Control No.: 96/000,064
Primary Examiner: Jason Proctor

Filing Date: May 9, 2014

No substantial new question of patentability is raised in the request for supplemental examination. See the Reasons for Substantial New Question of Patentability Determination in the file of this proceeding.

(56) Items of Information

U.S. PATENT DOCUMENTS

| | | |
|---|---|---|
| 7,741,734 | 6/2010 | Joannopoulos et al. |
| 7,825,543 | 11/2010 | Karalis et al. |
| 8,400,017 | 3/2013 | Kurs et al. |